United States Patent
Onishi (10) Patent No.: US 8,477,820 B2
(45) Date of Patent: Jul. 2, 2013

(54) SEMICONDUCTOR LASER DEVICE AND METHOD FOR PRODUCING THE SAME

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/267,080

(22) Filed: Oct. 6, 2011

(65) Prior Publication Data

US 2012/0093190 A1 Apr. 19, 2012

(30) Foreign Application Priority Data

Oct. 18, 2010 (JP) ................................ 2010-233865

(51) Int. Cl.
*H01S 5/00* (2006.01)
(52) U.S. Cl.
USPC .................... 372/50.11; 372/45.01; 372/96
(58) Field of Classification Search
USPC .................................................... 372/50.11
See application file for complete search history.

(56) References Cited

U.S. PATENT DOCUMENTS

| 6,768,760 | B2 * | 7/2004 | Mihashi et al. | 372/46.01 |
| 2002/0061046 | A1 * | 5/2002 | Takiguchi et al. | 372/96 |
| 2003/0138016 | A1 * | 7/2003 | Kise et al. | 372/46 |

OTHER PUBLICATIONS

T. Takiguchi et al., "1.3 μm Uncooled AlGaInAs-MQW DFB laser with λ/4-shifted Grating", Proceedings, Optical Fiber Communication Conference and Exhibit 2002, ThF3, pp. 417-418 w/ publication data sheet.

\* cited by examiner

*Primary Examiner* — Xinning Niu
(74) *Attorney, Agent, or Firm* — Smith, Gambrell & Russell, LLP (57) ABSTRACT

A semiconductor laser device includes a first semiconductor stack portion that includes a grating layer and an active layer provided on the grating layer. The grating layer has a first region and second region; a diffraction grating provided in the first region; a semiconductor ridge structure portion provided on the first semiconductor stack portion and extending in a first direction; and a pair of first trenches provided along both side faces of the semiconductor ridge structure portion with the first region of the grating layer being located between the trenches. The first trenches penetrate through the grating layer. The first region of the grating layer has an end extending in a second direction intersecting with the first direction. The end of the first region of the grating layer reaches a trench.

9 Claims, 9 Drawing Sheets

SEMICONDUCTOR LASER DEVICE AND METHOD FOR PRODUCING THE SAME

BACKGROUND OF THE INVENTION

1. Field of the Invention

The present invention relates to a semiconductor laser device and a method for producing the same.

2. Description of the Related Art

T. Takiguchi et al., "1.3 µm Uncooled AlGaInAs-MQW DFB laser with λ/4-shifted Grating" Proceedings, Optical Fiber Communication Conference and Exhibit 2002, ThF3, pp. 417-418 (Non-Patent Reference 1) describes a ridge-type semiconductor laser device having a diffraction grating. In this semiconductor laser device described in this reference, the diffraction grating is formed inside a ridge on the upper side of an active layer.

SUMMARY OF THE INVENTION

With the increased capacity of recent optical fiber communication systems, semiconductor laser devices with a high-speed operation of 10 gigabits per second (Gbps) or more has been desired. Ridge-type semiconductor laser devices can be operated at a high speed because the parasitic capacitance of the devices can be reduced.

Semiconductor laser devices for optical fiber communication systems are provided with a diffraction grating in order to obtain a dynamic single mode operation. Examples of such semiconductor laser devices having a diffraction grating include not only a device in which the diffraction grating is arranged on the upper side of an active layer, the device being described in Non-Patent Ref. 1, and a device in which the diffraction grating is arranged on the lower side of an active layer (i.e., arranged between a semiconductor substrate and the active layer). The diffraction grating is formed by employing an interference lithography method or an electron beam (EB) lithography method. In particular, when the EB lithography method is employed, in order to reduce the EB exposure time, the diffraction grating is formed not over the entire surface of a substrate but in such a manner that the width of the diffraction grating is limited in a direction orthogonal to an optical waveguide direction.

However, it is difficult to obtain the high-speed operation for the semiconductor laser device with a diffraction grating arranged between a semiconductor substrate and an active layer, especially when the width of the diffraction grating is limited. In general, a diffraction grating includes a grating layer and a semiconductor layer formed on the grating layer. Periodic projections and recesses are formed on a surface of the grating layer. The semiconductor layer on the grating layer is formed so as to cover the projections and recesses of this grating layer. The semiconductor layer on the grating layer has a refractive index different from the refractive index of the grating layer. When the diffraction grating is formed so as to have a finite width, the grating layer has two portions. One portion is a diffraction grating portion having the periodic projections and recesses, and other portion is a flat region without the periodic projections and recesses around the diffraction grating portion.

Here, when the grating layer has a lower band-gap energy than the band-gap energy of another semiconductor layer formed on the grating layer so as to cover the projections and recesses, the diffraction grating layer has a lower resistivity than that of the semiconductor layer formed on the grating layer. Therefore, the diffraction grating portion has a higher resistance than that of the flat region around the diffraction grating portion. Current flows through the diffraction grating portion. Furthermore, current also flows through the above peripheral region of diffraction grating portion in a bypass manner. As a result, the semiconductor laser device has two paths for current flow through the two portions of the diffraction grating layer. These paths for current flow have different lengths from each other. These may result in degrading the high-frequency response characteristics.

A semiconductor laser device according to the present invention includes a semiconductor substrate having a main surface; a first semiconductor stack portion that includes a grating layer provided on the main surface and an active layer provided on the grating layer, the grating layer having a first region and second region; a diffraction grating provided in the first region of the grating layer; a semiconductor ridge structure portion provided on the first semiconductor stack portion, the semiconductor ridge structure portion including a cladding layer and extending in a first direction; and a pair of first trenches provided in the first semiconductor stack portion along both side faces of the semiconductor ridge structure portion, the first region of the grating layer being located between the pair of first trenches. In addition, the pair of first trenches extends so as to penetrate through the grating layer. In addition, the first region of the grating layer has an end extending in a second direction, the second direction intersecting with the first direction. The end of the first region of the grating layer reaches the first trench.

The semiconductor laser device according to the embodiment includes a first semiconductor stack portion that includes a grating layer and an active layer provided on the grating layer, the grating layer having a first region and second region; a diffraction grating provided in the first region of the grating layer; and a semiconductor ridge structure portion provided on the first semiconductor stack portion. Furthermore, a pair of first trenches is provided in the first semiconductor stack portion along both side faces of the semiconductor ridge structure portion. The first region of the grating layer is located between the pair of first trenches. In addition, the pair of first trenches extends so as to penetrate through the grating layer. Furthermore, an end of the first region of the grating layer reaches the first trench. With this configuration, it is possible to effectively prevent a current from flowing through peripheral regions of the grating layer in a bypass manner. Thus, according to this semiconductor laser device, the current mainly flows through the diffraction grating, and thus good high-frequency response characteristics can be realized.

In the semiconductor laser device, the pair of first trenches may electrically separate the first region of the grating layer from the second region of the grating layer.

The semiconductor laser device may further include a second semiconductor stack portion provided on the first semiconductor stack portion, the second semiconductor stack portion including the cladding layer. In addition, the semiconductor ridge structure portion is formed by a pair of second trenches provided in the second semiconductor stack portion. The pair of first trenches is provided at the bottom of the pair of second trenches.

In the semiconductor laser device, the semiconductor ridge structure portion is preferably formed by a pair of second trenches provided in a second semiconductor stack portion. In addition, the pair of first trenches provided in the first semiconductor stack portion may be provided at the bottom of the pair of second trenches.

In the semiconductor laser device, each of the first trenches has a smaller opening width in the second direction than a width of a portion of an inner surface of the second trench in the second direction, the portion of the inner surface of the second trench being constituted by the first semiconductor stack portion. That is, the opening width of the first trenches in the second direction is smaller than a width of the bottom of the second trenches.

The semiconductor laser device may further include a second semiconductor stack portion that includes the cladding layer and that is provided on the first semiconductor stack portion. In addition, the semiconductor ridge structure portion is formed by a pair of second trenches provided in the second semiconductor stack portion. Each of the pair of second trenches is provided between one of the pair of first trenches and the semiconductor ridge structure portion.

The semiconductor laser device may further include an insulating film provided on a top surface of the semiconductor ridge structure portion and inner surfaces of the pair of first trenches; and an electrode provided on the semiconductor ridge structure portion. In addition, the electrode is in direct contact with the top surface of the semiconductor ridge structure portion through an opening formed in the insulating film.

A method for producing a semiconductor laser device according to the present invention includes the steps of forming a grating layer on a semiconductor substrate, the grating layer having a first region and second region; forming a diffraction grating having periodic projections and recesses in the first region of the grating layer; forming an active layer and a cladding layer on the grating layer; forming a semiconductor ridge structure portion extending in a first direction by etching the cladding layer; and forming a pair of first trenches along both side faces of the semiconductor ridge structure portion, the pair of first trenches penetrating through the grating layer. Furthermore, in the step of forming the pair of first trenches, the pair of first trenches is formed in the first region of the grating layer. In addition, in the step of forming the diffraction grating, a mask having a pattern for forming the diffraction grating is formed by an electron beam lithography method in the first region, and the grating layer in the first region is etched by using the mask to form the diffraction grating, the first region having a width smaller than a width of the semiconductor substrate in a second direction, the second direction intersecting with the first direction.

In the method for producing a semiconductor laser device, a diffraction grating is formed by etching a grating layer through a mask that has been patterned by an electron beam (EB) lithography method. The EB lithography method requires a long time for patterning, as compared with other methods such as an interference lithography method. Therefore, in order to reduce the time necessary for forming the diffraction grating, a width of the diffraction grating is decreased, and a pattern for forming the diffraction grating is formed in a region having a width smaller than a width of a semiconductor substrate in a second direction that intersects with the first direction. Thus, the electron beam (EB) drawing time can be reduced. In addition, a pair of first trenches is formed in a first region of the grating layer where the diffraction grating is formed. Accordingly, a current can be concentrated in a portion of the grating layer located between the pair of first trenches. Therefore, even when a diffraction grating is formed not over the entire surface of the device, but on a portion of the surface thereof so as to have a small width, it is possible to prevent a current from flowing through the peripheral regions of the grating layer in a bypass manner. Therefore, a high speed semiconductor laser device with good high-frequency response characteristics can be obtained.

In the method for producing a semiconductor laser device, in the step of forming the semiconductor ridge structure portion, the semiconductor ridge structure portion may be formed by forming a pair of second trenches by etching the cladding layer. In addition, in the step of forming the pair of first trenches, the pair of first trenches may be formed by etching portions of the active layer and the grating layer that are located at the bottom of the pair of second trenches.

DESCRIPTION OF THE PREFERRED EMBODIMENTS

Embodiments of semiconductor laser devices according to the present invention will now be described in detail with reference to the accompanying drawings. In a description of the drawings, the same elements are assigned the same reference numerals and an overlapping description is omitted.

First Embodiment

Figure 1:
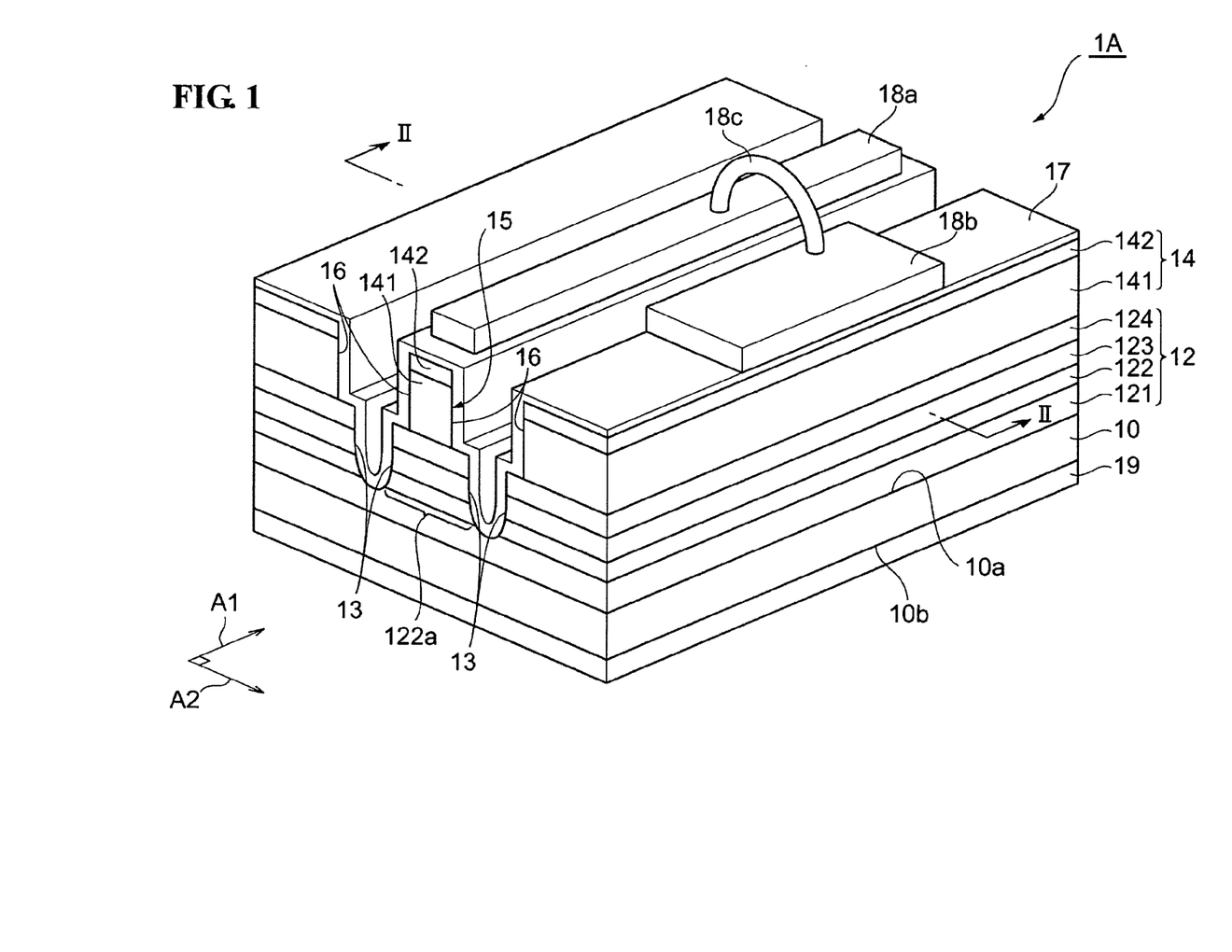
FIG. 1 is a perspective view showing a configuration of a semiconductor laser device according to a first embodiment of the present invention.
Figure 2:
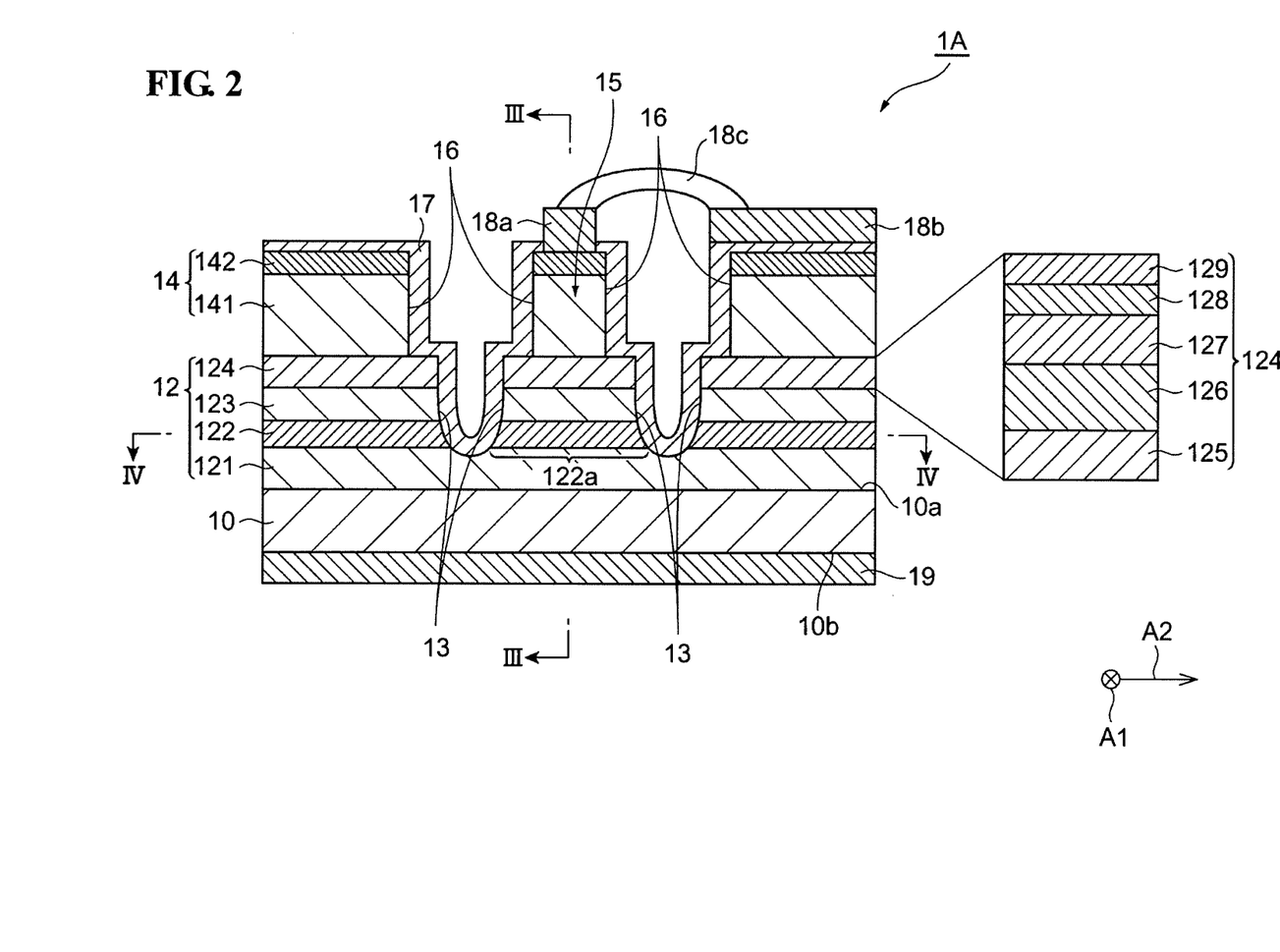
FIG. 2 is a cross-sectional view of the semiconductor laser device taken along line II-II of FIG. 1.
Figure 3:
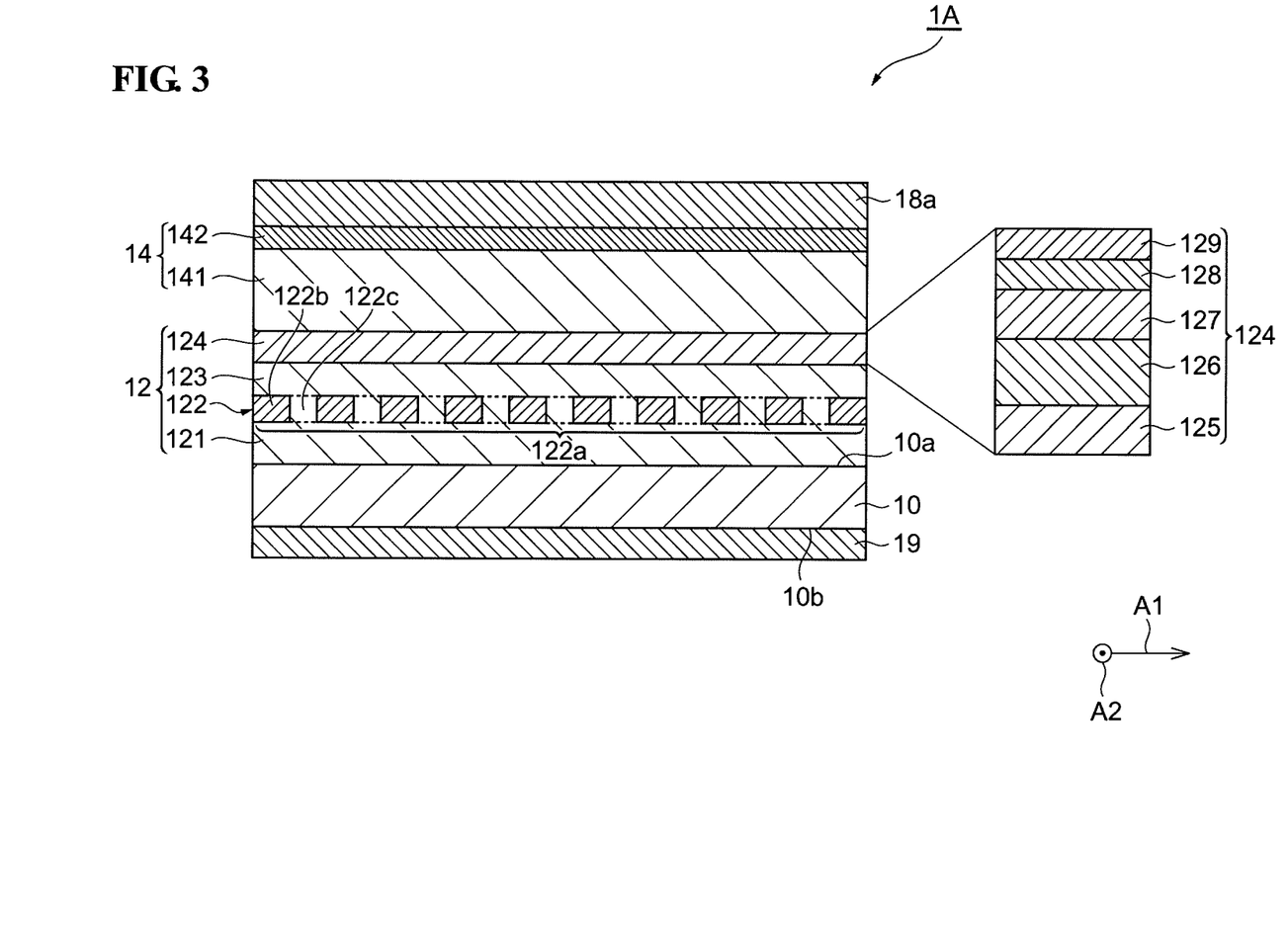
FIG. 3 is a cross-sectional view of the semiconductor laser device taken along line III-III of FIG. 2.
Figure 4:
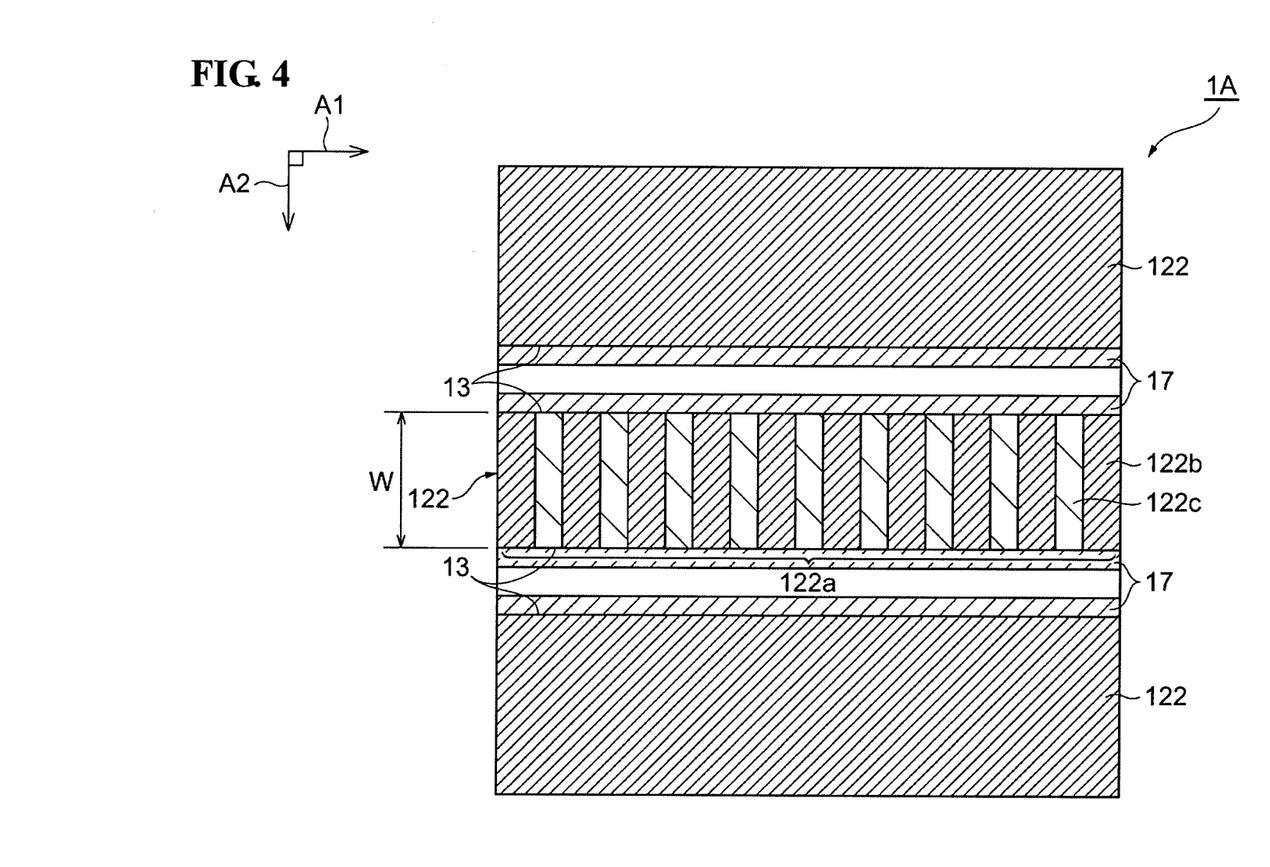
FIG. 4 is a cross-sectional view of the semiconductor laser device taken along line IV-IV of FIG. 2.

FIG. 1 is a perspective view showing a configuration of a semiconductor laser device according to a first embodiment of the present invention. FIG. 2 is a cross-sectional view of the semiconductor laser device taken along line II-II of FIG. 1. FIG. 3 is a cross-sectional view of the semiconductor laser device taken along line III-III of FIG. 2. In FIGS. 2 and 3, an enlarged cross-sectional view of a core layer, which is a portion of the semiconductor laser device, is also shown. FIG. 4 is a cross-sectional view of the semiconductor laser device taken along line IV-IV of FIG. 2.

As shown in FIGS. 1 to 4, a semiconductor laser device 1A of this embodiment includes a semiconductor substrate 10 and semiconductor stack portions 12 and 14. The semiconductor substrate 10 is composed of a semiconductor of a first conductivity type (for example, n type) and has a main surface 10a. For example, the semiconductor substrate 10 is composed of n-type InP.

The semiconductor stack portion 12 is a first semiconductor stack portion in this embodiment. The first semiconductor stack portion 12 is provided on the main surface 10a of the semiconductor substrate 10. The first semiconductor stack portion 12 includes a buffer layer 121, a grating layer 122, a spacer layer 123, and a core layer 124.

The buffer layer 121 is provided on the main surface 10a of the semiconductor substrate 10. The buffer layer 121 is composed of a III-V group compound semiconductor of the first conductivity type and is composed of for example, n-type InP. The buffer layer 121 preferably has a thickness of, for example, 100 nm.

The grating layer 122 has a diffraction grating and is provided on the buffer layer 121 on the main surface 10a. The grating layer 122 is composed of a III-V group compound semiconductor of the first conductivity type and is composed of, for example, n-type GaInAsP. The grating layer 122 preferably has a thickness of, for example, 50 nm.

As shown in FIGS. 3 and 4, the grating layer 122 includes a region where a diffraction grating 122a is formed. The region of the grating layer 122 where the diffraction grating 122a is formed is a first region in the embodiment, and other region of the grating layer 122 where the diffraction grating 122a is not formed is a second region in the embodiment. In the diffraction grating 122a, regions 122b including the grating layer 122 composed of n-type GaInAsP and regions 122c composed of n-type InP are periodically and alternately arranged in a predetermined first direction (optical waveguide direction, shown by the arrow A1 in the figures). Thus, the regions 122b composed of n-type GaInAsP and the regions 122c composed of n-type InP are periodically arranged, whereby the diffraction grating 122a is configured so that the refractive index periodically changes in the predetermined first direction. In these figures, a second direction A2 that intersects with the first direction A1 is shown. A width W (refer to FIG. 4) of the region where the diffraction grating 122a is formed in the direction A2 is smaller than a width of the semiconductor substrate 10 in the direction A2. In other words, the diffraction grating 122a is not formed on the entire surface of the substrate. The diffraction grating 122a is formed in a predetermined region having the width W in the direction A2. In addition, the diffraction grating 122a may include a phase shift portion (for example, λ/4 phase shift portion) (not shown).

The spacer layer 123 is provided on the grating layer 122 and covers the diffraction grating 122a. The spacer layer 123 is composed of a III-V group compound semiconductor of the first conductivity type and is composed of, for example, n-type InP. The spacer layer 123 preferably has a thickness of, for example, 100 nm.

The core layer 124 is provided on the grating layer 122 (on the spacer layer 123 in this embodiment). The core layer 124 includes a lower optical confinement layer 125, an active layer 126, an upper optical confinement layer 127, a semiconductor layer 128, and a semiconductor layer 129. The lower optical confinement layer 125 is composed of a III-V group compound semiconductor of the first conductivity type, and is composed of, for example, n-type AlGaInAs. The upper optical confinement layer 127 is composed of a III-V group compound semiconductor of a second conductivity type, and is composed of, for example, p-type AlGaInAs. Each of the lower optical confinement layer 125 and the upper optical confinement layer 127 preferably has a thickness of, for example, 50 nm.

The active layer 126 is provided between the lower optical confinement layer 125 and the upper optical confinement layer 127. The active layer 126 has, for example, a multi-quantum well (MQW) structure in which well layers and barrier layers are alternately stacked. The well layers and the barrier layers are composed of III-V group compound semiconductors having different compositions. For example, the well layers and the barrier layers are each composed of AlGaInAs. The number of well layers is, for example, 7, and the number of barrier layers is, for example, 8.

The semiconductor layers 128 and 129 are each composed of a III-V group compound semiconductor of the second conductivity type. The semiconductor layer 128 is provided on the upper optical confinement layer 127, and the semiconductor 129 is provided on the semiconductor layer 128. For example, the semiconductor layer 128 is composed of p-type AlInAs, and the semiconductor layer 129 is composed of p-type GaInAsP. The semiconductor layers 128 and 129 each preferably have a thickness of 30 nm. The semiconductor layer 128 is a so-called carrier stop layer for suppressing leakage of electrons from the active layer 126. The semiconductor layer 129 functions as an etch-stop layer when a pair of second trenches 16 described below is formed.

A pair of first trenches 13 is formed in the semiconductor stack portion 12 having the stacked structure described above. The pair of first trenches 13 is provided in order to block a current bypassing the region where the diffraction grating 122a is formed. Specifically, the pair of first trenches 13 is formed along both side faces of a semiconductor ridge structure portion 15 described below and extends in the first direction A1. Furthermore, as shown in FIG. 2, the pair of first trenches 13 is formed so as to penetrate through the grating layer 122 and to reach the buffer layer 121. As shown in FIG. 4, in the grating layer 122, the region with the diffraction grating 122a and the region without the diffraction grating 122a arranged at peripheral regions thereof are separated from each other by the pair of first trenches 13. Furthermore, both ends of the region where the diffraction grating 122a is formed, the ends extending in the direction A2, reach the pair of first trenches 13. Thus, portions of the inner wall surfaces of the pair of first trenches 13 are constituted by the diffraction grating 122a.

The semiconductor stack portion 14 is a second semiconductor stack portion in this embodiment and is provided on the semiconductor stack portion 12. The semiconductor stack portion 14 of this embodiment includes a cladding layer 141 and a contact layer 142. The cladding layer 141 is provided on the core layer 124, and the contact layer 142 is provided on the cladding layer 141. The cladding layer 141 and the contact layer 142 are each composed of a III-V group compound semiconductor of the second conductivity type. For example, the cladding layer 141 is composed of p-type InP, and the contact layer 142 is composed of p-type InGaAs. The cladding layer 141 preferably has a thickness of 1,500 nm, and the contact layer 142 preferably has a thickness of 400 nm.

The pair of second trenches 16 is formed in the semiconductor stack portion 14. The pair of second trenches 16 is trenches for forming both side faces of the semiconductor ridge structure portion 15. Specifically, the pair of second trenches 16 is formed along a region where the semiconductor ridge structure portion 15 is to be formed and extends in the first direction A1. Furthermore, as shown in FIG. 2, the pair of second trenches 16 is formed so as to reach the core layer 124 of the semiconductor stack portion 12. As shown in FIGS. 1 and 2, the semiconductor ridge structure portion 15 extending in the first direction A1 is formed on the semiconductor stack portion 12 between the pair of second trenches 16. This semiconductor ridge structure portion 15 is provided in order to intensively supply a current to a region of the core layer 124, the region being located under semiconductor ridge structure portion 15, and to form an optical waveguide. Therefore, current and light are confined in the region of the core layer 124 located under semiconductor ridge structure portion 15. The semiconductor ridge structure portion 15 includes a portion of the cladding layer 141 and a portion of the contact layer 142. The semiconductor ridge structure portion 15 preferably has a width of 1.5 μm in the second direction A2. The semiconductor ridge structure portion 15 preferably has a height of 2 μm from the top surface of the semiconductor stack portion 12. The bottoms of the pair of second trenches 16 each preferably have a width of 50 μm in the second direction A2.

In this embodiment, the pair of first trenches 13 described above is formed at the bottom of the pair of second trenches 16. Specifically, the pair of first trenches 13 is formed in a portion of the semiconductor stack portion 12 constituting the bottom of the trenches 16. An opening width of each of the first trenches 13 in the second direction A2 is smaller than a width of the bottom of the second trench 16. Therefore, the opening width of each of the first trenches 13 in the second direction A2 is smaller than a distance between a side face of the semiconductor ridge structure portion 15 and an opposing side face of the semiconductor stack portion 14. This means that the pair of first trenches 13 and the pair of second trenches 16 form steps that separate or offset the side faces of the semiconductor ridge structure portion 15 from the side faces of the semiconductor stack portion 12. Each of the opening portions of the pair of first trenches 13 preferably has a width of 10 μm in the second direction A2.

In addition to the configuration described above, the semiconductor laser device 1A includes an insulating film 17, an anode electrode 18a, an electrode pad 18b, and a cathode electrode 19. The insulating film 17 is provided so as to cover the surface of the semiconductor laser device 1A. Specifically, the insulating film 17 is formed on the top surface of the semiconductor stack portion 14, the top surface and the side faces of the semiconductor ridge structure portion 15, the inner surfaces of the pair of first trenches 13, and the inner surfaces of the pair of second trenches 16. The insulating film 17 is composed of, for example, a silicon oxide ($SiO_2$) film or a silicon nitride (SiN) film. The anode electrode 18a is provided on the semiconductor ridge structure portion 15. The anode electrode 18a is in direct contact with the contact layer 142 through an opening formed in the insulating film 17. The electrode pad 18b is provided on the semiconductor stack portion 14 located outside one of the second trenches 16. The electrode pad 18b is electrically connected to the anode electrode 18a via a wire 18c. The cathode electrode 19 is provided on a back surface 10b of the semiconductor substrate 10.

Figure 5:
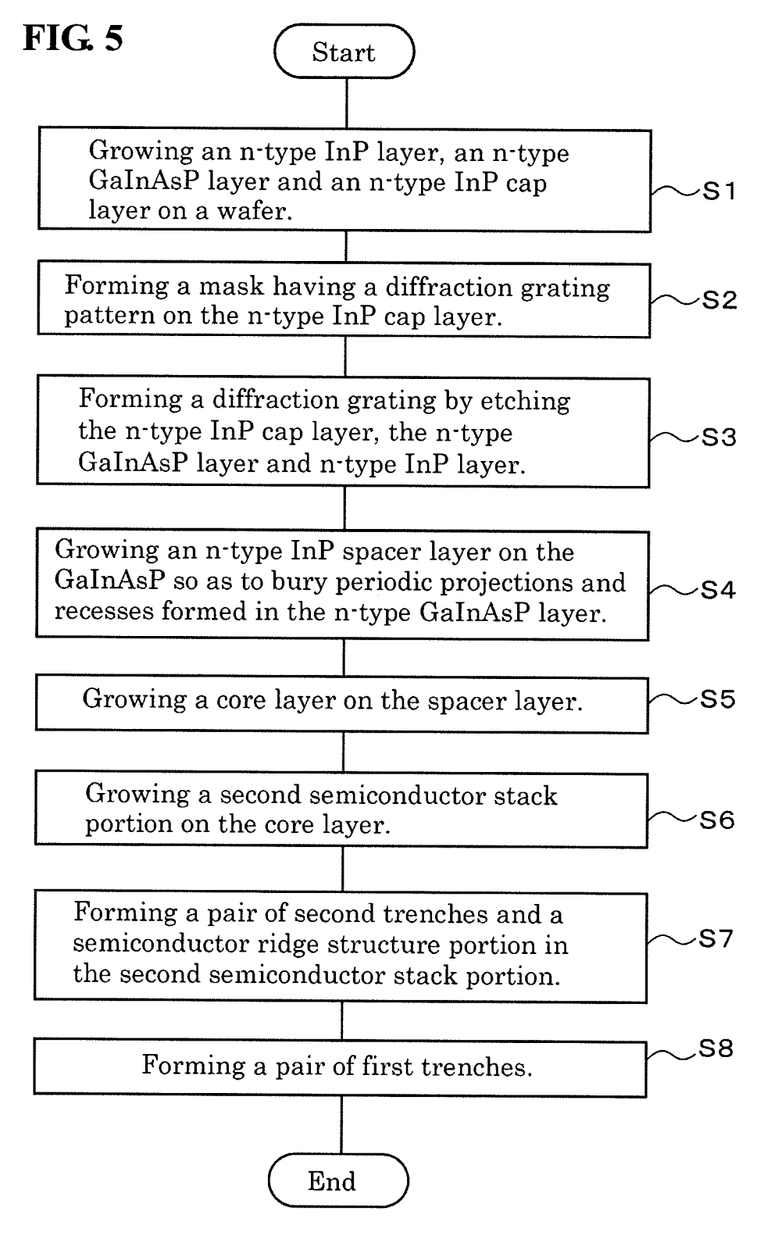
FIG. 5 is a flowchart showing an example of a method for producing the semiconductor laser device.

A description will be made of an example of a method for producing the semiconductor laser device 1A having the above configuration. FIG. 5 is a flowchart showing an example of a method for producing the semiconductor laser device 1A. Note that, in the description below, silicon (Si) is suitable for an n-type dopant, and zinc (Zn) is suitable for a p-type dopant.

First, a wafer that is a semiconductor substrate 10 is loaded in a growth furnace. An n-type InP layer (thickness: 100 nm) for a buffer layer 121, an n-type GaInAsP layer (thickness: 50 nm) for a grating layer 122, and an n-type InP cap layer (thickness: 10 nm) are grown on a main surface of the wafer in that order (Step S1). Next, a $SiO_2$ film (thickness: 100 nm) is deposited on the n-type InP cap layer. A resist is applied onto the $SiO_2$ film, and a diffraction grating pattern for forming a diffraction grating 122a by EB lithography is formed on the resist. In this case, a width of the diffraction grating pattern in the second direction A2 is, for example, 35 μm, and a length of a region where the diffraction grating pattern is formed in the first direction A1 is, for example, 200 μm. Thus, the diffraction grating pattern formed by EB lithography is not formed over the entire surface of the wafer or over the entire surface of a device, but is formed only on a portion of the surface. In particular, the width of the diffraction grating pattern in the second direction A2 is limited. By forming such a pattern, the process time of the EB lithography can be reduced. Furthermore, in this step, a portion for a phase shift portion having a different period may be formed in the diffraction grating pattern. Next, a dry etching process is performed on the $SiO_2$ film through the resist to transfer the pattern to the $SiO_2$ film. Thus, a mask having the diffraction grating pattern for forming the diffraction grating 122a is formed on the n-type InP cap layer (Step S2). The resist is then removed.

Subsequently, a dry etching process is performed on the n-type InP cap layer, the n-type GaInAsP layer, and the n-type InP layer (Step S3). The etching depth in this step is, for example, 70 nm. Thus, a periodic structure including projections and recesses, the periodic structure forming the diffraction grating 122a, are formed in the n-type GaInAsP layer. The $SiO_2$ film functioning as the mask is then removed.

After processing the above steps, the wafer is again loaded in the growth furnace. An n-type InP layer (100 nm) for a spacer layer 123 is grown on the n-type GaInAsP layer (Step S4). In this step, the spacer layer 123 is formed and the periodic structure including the projections and recesses formed in the n-type GaInAsP layer is buried by n-type InP. As a result, regions composed of n-type GaInAsP and regions composed of n-type InP are alternately arranged to form the diffraction grating 122a. Subsequently, an n-type AlGaInAs layer (50 nm) for a lower optical confinement layer 125, an AlGaInAs multi-quantum well structure for an active layer 126, a p-type AlGaInAs layer (50 nm) for an upper optical confinement layer 127, a p-type AlInAs layer (30 nm) for a semiconductor layer 128, and a p-type GaInAsP layer (30 nm) for a semiconductor layer 129 are grown on the spacer layer 123 in that order (Step S5). Thus, a semiconductor stack portion 12 is formed. Furthermore, a p-type InP layer (1,500 nm) for a cladding layer 141 and a p-type InGaAs layer (400 nm) for a contact layer 142 are grown thereon. Thus, a semiconductor stack portion 14 is formed (Step S6).

Next, a $SiO_2$ film (500 nm) is deposited on the contact layer 142. This $SiO_2$ film is etched by a dry etching process using a photolithography method, thereby forming a mask for forming a pair of second trenches 16. Next, a dry etching process is performed on the semiconductor stack portion 14 (i.e., the contact layer 142 and the cladding layer 141) through the mask using a gas mixture composed of methane and hydrogen. In this step, it is preferable to stop the dry etching process at the time when the etching depth reaches the semiconductor layer 129. Thus, the pair of second trenches 16 is formed in the semiconductor stack portion 14, and the semiconductor ridge structure portion 15 is also formed in the semiconductor stack portion 14 (Step S7). The $SiO_2$ film functioning as the mask is then removed.

Subsequently, a $SiO_2$ film for an insulating film 17 is deposited on the top surface of the semiconductor stack portion 14, the top surface and the side faces of the semiconductor ridge structure portion 15, and the inner surfaces of the pair of second trenches 16 by plasma chemical vapor deposition (CVD). In this step, for example, $SiH_4$ and $O_2$ can be used as the source materials in the CVD process. The deposition temperature is, for example, 400° C. Next, a portion of the $SiO_2$ film, the portion being located on the bottom of each of the pair of second trenches 16, is removed by a dry etching process. A wet etching process is performed on the semiconductor stack portion 12 disposed at the bottom of the trenches 16 by using the $SiO_2$ film as a mask. In this step, the etching depth is determined so that the grating layer 122 is penetrated (for example, 3 μm). Thus, a pair of first trenches 13 is formed (Step S8). In this step, the formation positions of the pair of first trenches 13 are determined so that the inside surfaces of the pair of first trenches 13 overlap with the diffraction grating 122a. Thus, the diffraction grating 122a is exposed on the inside surfaces of the pair of first trenches 13.

Subsequently, a $SiO_2$ film for the insulating film 17 is deposited on the entire surface including the inner surfaces of the pair of first trenches 13. Next, a portion of the insulating film 17, the portion being located on the top surface of the semiconductor ridge structure portion 15, is removed to form an opening so that the contact layer 142 is exposed. An anode electrode 18a is then formed on the semiconductor ridge structure portion 15, and an electrode pad 18b is formed on the semiconductor stack portion 14. A cathode electrode 19 is further formed on a back surface of the semiconductor substrate 10. The wafer is then cleaved to form a chip bar which has a width of, for example, 200 μm and in which a plurality of devices are arranged in parallel. An anti-reflection (AR) coating and a high-reflection (HR) coating are formed on an end face of the chip bar. Lastly, respective devices are cut from this chip bar. Thus, semiconductor laser devices 1A of this embodiment are produced.

Figure 6:
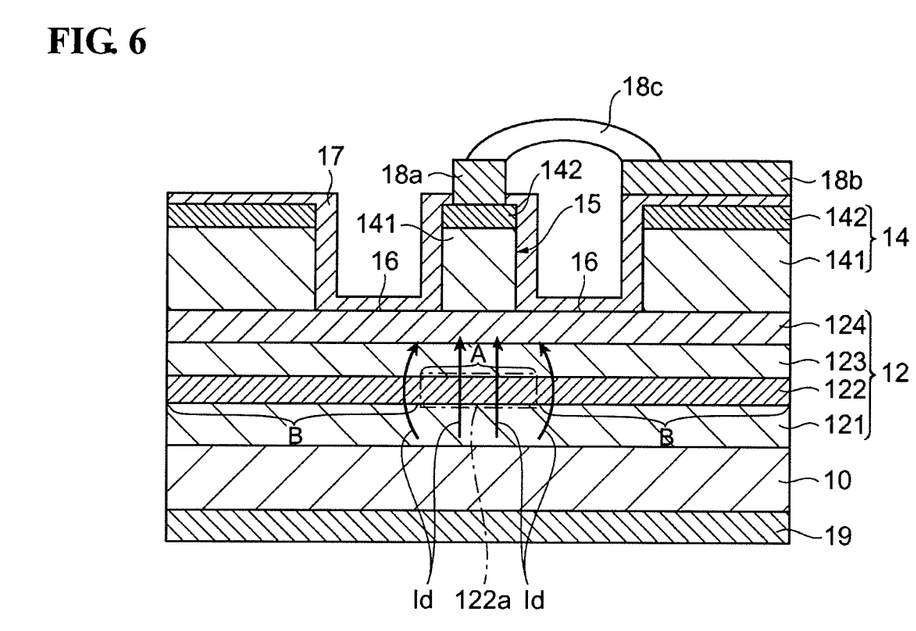
FIG. 6 is a view showing a cross-sectional structure of a conventional semiconductor laser device having a finite-width diffraction grating.

The operation and effect obtained by the semiconductor laser device 1A of this embodiment will be described. As described above, a diffraction grating is formed by, for example, an interference lithography method or an EB lithography method, and the width of the diffraction grating in a direction (second direction A2) orthogonal to the optical waveguide direction may be designed to be finite. FIG. 6 shows a cross-sectional structure of a conventional semiconductor laser device having a finite-width diffraction grating. Note that the configuration of this semiconductor laser device is the same as that of the semiconductor laser device 1A of this embodiment except that the pair of first trenches 13 is not formed.

However, the semiconductor laser device having a finite-width diffraction grating 122a between a semiconductor substrate 10 and an active layer 126 has a poor high-frequency response. The diffraction grating 122a is formed so that regions 122b including the grating layer 122 composed of GaInAsP and regions 122c composed of InP are alternately arranged with a predetermined period in the optical waveguide direction (first direction A1). Semiconductor materials (e.g., GaInAsP and InP) constituting the diffraction grating 122a have different refractive indices and band gap energies from each other. When the diffraction grating 122a is formed so as to have a finite width as shown in FIG. 6, the grating layer 122 composed of GaInAsP is disposed on the entire surface of peripheral regions (i.e., regions B in FIG. 6) of the diffraction grating 122a.

In addition, since the band-gap energy of GaInAsP constituting the grating layer 122 is lower than the band-gap energy of InP, current flows non-uniformly. Current mainly flows through the regions composed of GaInAsP which has a lower band gap energy than that of InP. When the width of the diffraction grating 122a is finite, the current Id flowing through the active layer 126 partially flows through the peripheral regions B of the grating layer 122 in a bypass manner, as shown in FIG. 6. As a result, the flow path through the peripheral regions B becomes longer than the flow path through the diffraction grating 122a, thereby causing a delay of the movement of carriers. Consequently, the high-frequency response characteristics of the semiconductor laser device are degraded.

In the semiconductor laser device 1A of this embodiment, a pair of first trenches 13 for blocking a current is formed in the semiconductor stack portion 12 along both side faces of the semiconductor ridge structure portion 15. In addition, the pair of first trenches 13 is formed so as to penetrate through the grating layer 122, and both ends of a region where the diffraction grating 122a is formed reach the pair of first trenches 13. With this configuration, it is possible to effectively prevent a current from flowing through peripheral regions of the grating layer 122 in a bypass manner. Thus, according to the semiconductor laser device 1A of this embodiment, the current mainly flows through the diffraction grating 122a, and thus good high-frequency response characteristics can be realized.

Figure 7:
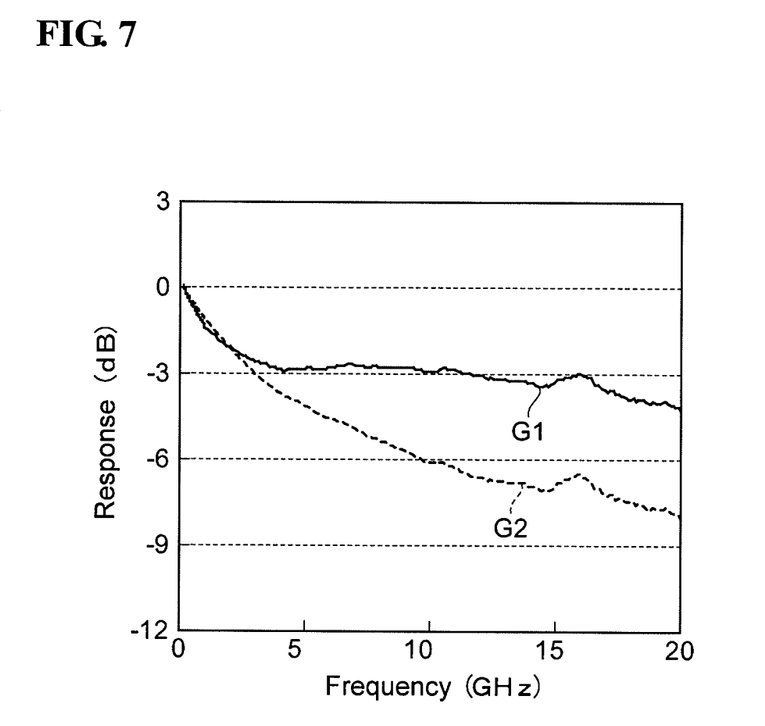
FIG. 7 is a graph showing the frequency response characteristics for the semiconductor laser device of the embodiment and the semiconductor laser device shown in FIG. 6.

FIG. 7 is a graph showing the frequency response characteristics for the semiconductor laser device 1A of this embodiment and the semiconductor laser device shown in FIG. 6. In FIG. 7, the vertical axis represents a response (unit: dB) and the horizontal axis represents a frequency (unit: GHz). Graph G1 shows the evaluation result of the semiconductor laser device 1A of this embodiment, and graph G2 shows the evaluation result of the semiconductor laser device shown in FIG. 6. As shown in FIG. 7, in the semiconductor laser device shown in FIG. 6, frequency response is degraded, especially in the high frequency band. This semiconductor laser device cannot operate at high modulation frequency of 10 Gbps, for example. In contrast, in the semiconductor laser device 1A of this embodiment, the high-frequency response is apparently improved, and this semiconductor laser device 1A can operate at high modulation frequency of 10 Gbps or more.

Furthermore, in producing a semiconductor laser device, for example, it is not desirable to form a diffraction grating having a large width (e.g., a width of 250 μm) by EB lithography because the EB drawing time is very long. According to this embodiment, the above-described problem can be prevented for the semiconductor laser device having a diffraction grating with a small width (for example, a width of 30 μm or more and 100 μm or less). Thus, a high speed semiconductor laser device operating at modulation frequency of 10 Gbps or more can be realized while ensuring satisfactory production efficiency.

As in this embodiment, the pair of first trenches 13 is formed in the semiconductor stack portion 12. With this configuration, it is possible to effectively block a current that bypasses the diffraction grating 122a.

As in this embodiment, the diffraction grating 122a may be formed by etching the grating layer 122 through a mask that has been patterned by an EB lithography method. The EB lithography method requires a long time for patterning, as compared with other methods such as an interference lithography method. Therefore, in order to reduce the time necessary for forming the diffraction grating 122a, it is desirable to decrease the width of the diffraction grating 122a and to reduce the EB drawing time. According to the semiconductor laser device 1A of this embodiment, even when the width of the diffraction grating 122a is decreased in this manner, it is possible to prevent a current from flowing through the peripheral regions B of the grating layer 122 in a bypass manner. Therefore, a high speed semiconductor laser device with good high-frequency response characteristics can be obtained.

In addition, as described above, the diffraction grating 122a may include a phase shift portion. Since the period of the diffraction grating 122a is discontinuous in the phase shift portion, the EB lithography method is often employed when a diffraction grating 122a including such a phase shift portion is formed. As described above, this semiconductor laser device 1A is particularly effective when the diffraction grating 122a is formed by employing the EB lithography method.

In this embodiment, the EB drawing time can be further reduced by further decreasing the width W of the diffraction grating 122a by decreasing the distance between the first trenches 13. However, when the width W of the diffraction grating 122a is excessively decreased, it becomes difficult to uniformly bury the diffraction grating 122a. Accordingly, the width W of the diffraction grating 122a is preferably, for example, 22 µm or more.

Second Embodiment

Figure 8:
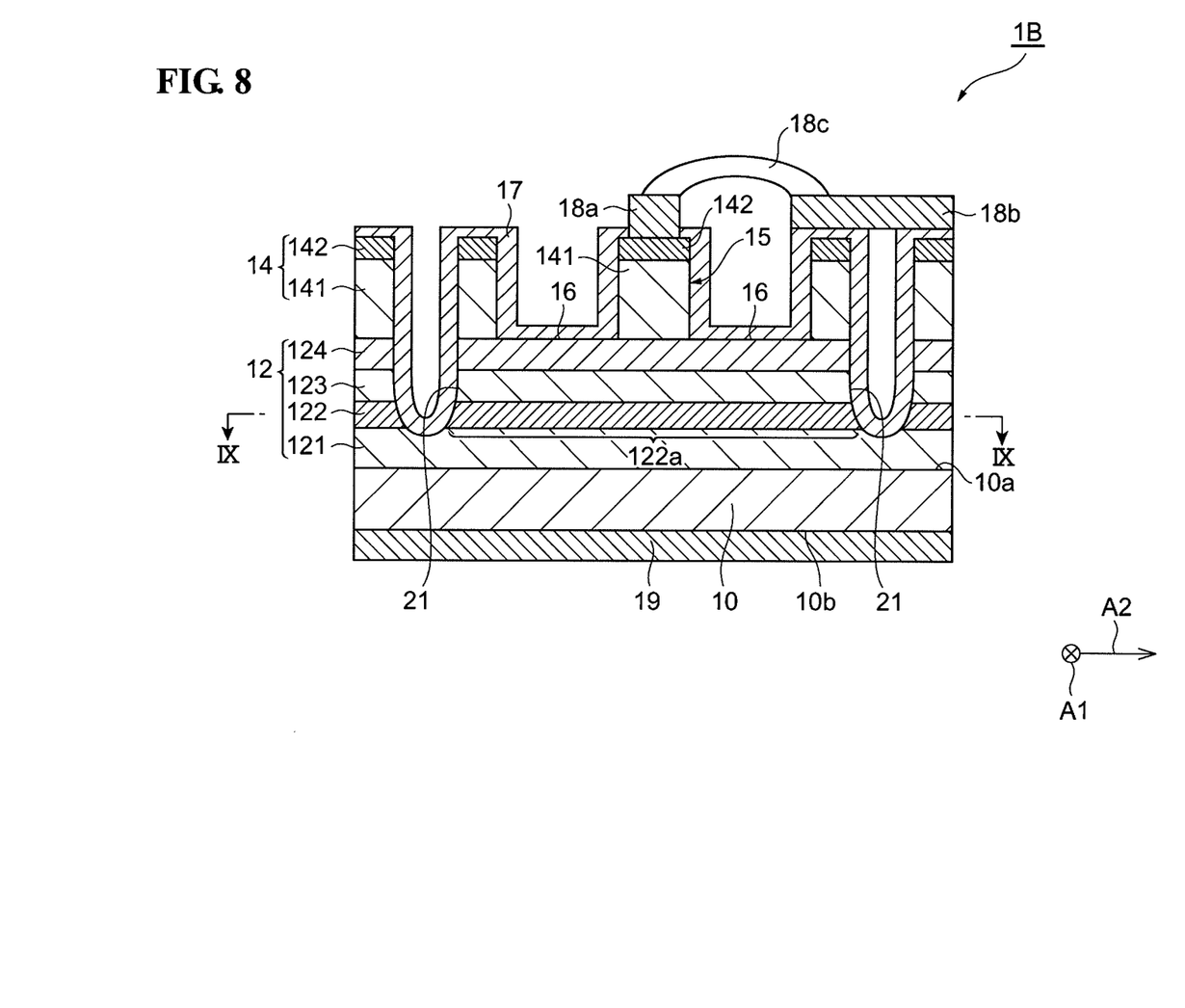
FIG. 8 is a cross-sectional view showing a configuration of a semiconductor laser device according to a second embodiment of the present invention.
Figure 9:
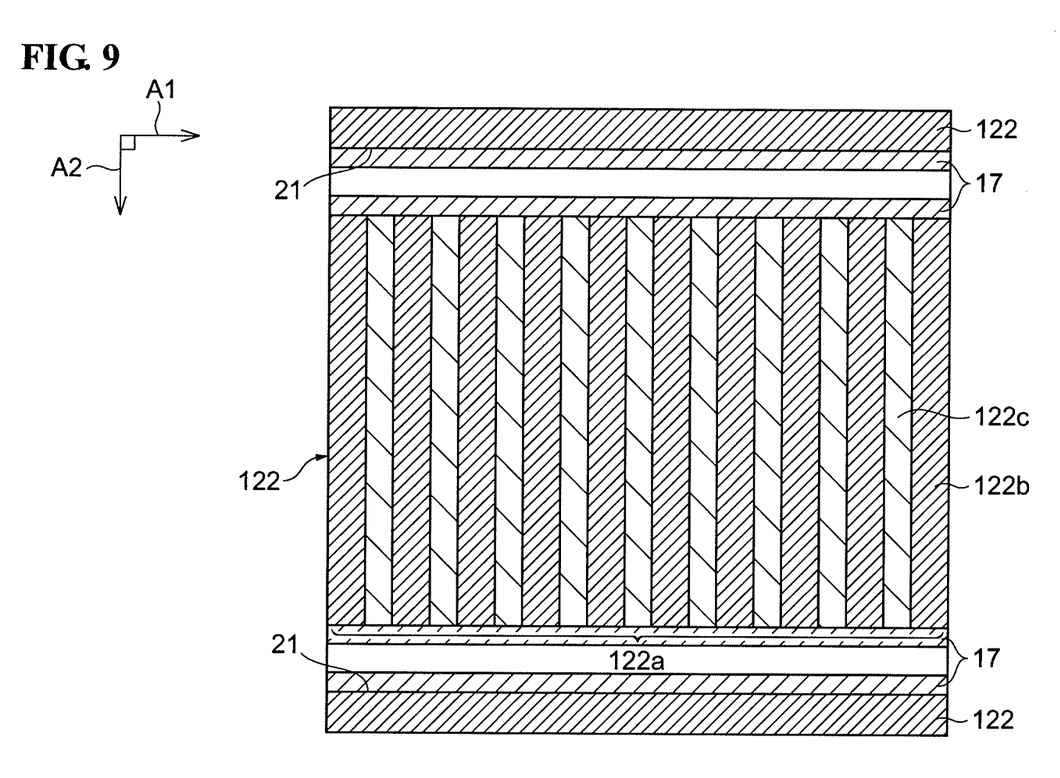
FIG. 9 is a cross-sectional view of the semiconductor laser device taken along line IX-IX of FIG. 8.

FIG. 8 is a cross-sectional view showing a configuration of a semiconductor laser device according to a second embodiment of the present invention. FIG. 9 is a cross-sectional view of the semiconductor laser device taken along line IX-IX of FIG. 8. A difference between a semiconductor laser device 1B of this embodiment and the semiconductor laser device 1A of the first embodiment will now be described.

The semiconductor laser device 1B of this embodiment differs from the semiconductor laser device 1A of the first embodiment in the configuration of a pair of first trenches 13. Specifically, the semiconductor laser device 1B includes a pair of first trenches 21 instead of the pair of first trenches 13 in the first embodiment. The pair of first trenches 21 is provided in order to block a current that bypasses a region where a diffraction grating 122a is formed. More specifically, the pair of first trenches 21 is formed along both side faces of a semiconductor ridge structure portion 15 and extends in a first direction A1. Furthermore, as shown in FIG. 8, the pair of first trenches 21 is formed outside a pair of second trenches 16 when viewed from the semiconductor ridge structure portion 15. In other words, each of the pair of second trenches 16 is formed between one of the pair of first trenches 21 and the semiconductor ridge structure portion 15.

In addition, the pair of first trenches 21 is formed so as to penetrate through a grating layer 122 and to reach a buffer layer 121. As shown in FIG. 9, the region where the diffraction grating 122a is formed in the grating layer 122, and peripheral regions thereof are separated by the pair of first trenches 21. Furthermore, both ends of the region where the diffraction grating 122a is formed, the ends extending in a direction A2, reach the pair of first trenches 21. Thus, portions of the inner wall surfaces of the pair of first trenches 21 are constituted by the diffraction grating 122a.

According to the semiconductor laser device 1B of this embodiment, it is possible to effectively prevent a current from flowing through the peripheral regions of the grating layer 122 in a bypass manner by the same operation as that of the first embodiment. Accordingly, the current mainly flows through the diffraction grating 122a, and thus good high-frequency response characteristics can be realized. The semiconductor laser device 1B of this embodiment can be preferably produced by forming the pair of first trenches 21 instead of the pair of first trenches 13 in the method of producing the semiconductor laser device 1A described in the first embodiment.

In addition, as in this embodiment, by forming the pair of first trenches 21 outside the pair of second trenches 16, high alignment accuracy of a process for forming the pair of first trenches 21 is not required. Therefore, the pair of first trenches 21 can be formed easier than those in the first embodiment.

The semiconductor laser device according to the present invention is not limited to the embodiments described above and various other modifications can be made. For example, in the above embodiments, a pair of trenches is formed in order to block a current that bypasses a region where a diffraction grating is formed. However, in the present invention, the current blocking structures for blocking a bypass current are not limited thereto. For example, high-resistance semiconductor regions may be formed in the first semiconductor stack portion so as to penetrate through the grating layer. For example, the high-resistance semiconductor regions can be formed by increasing the resistance of a portion of the first semiconductor stack portion by injecting ions (protons) into regions corresponding to the first trenches of the first semiconductor stack portion. Alternatively, a pair of trenches for blocking a bypass current is formed, and an Fe-doped InP layer may then be buried therein as a high-resistance semiconductor layer. Thus, the high-resistance semiconductor regions may be formed. Alternatively, a pair of first trenches formed and a pair of second trenches constituting a ridge portion may be filled with a benzocyclobutene (BCB) resin layer so as to flatten the surface of the semiconductor laser device. In this case, the surface of the device is planarized, and thus an electrode pad can be provided on the BCB resin layer.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:
1. A semiconductor laser device comprising:
a semiconductor substrate having a main surface;
a first semiconductor stack portion that includes a grating layer provided on the main surface and an active layer provided on the grating layer, the grating layer having a first region and a second region;
a diffraction grating provided in the first region of the grating layer;
a semiconductor ridge structure portion provided on the first semiconductor stack portion, the semiconductor ridge structure portion including a cladding layer and extending in a first direction;
a pair of first trenches provided in the first semiconductor stack portion along both side faces of the semiconductor ridge structure portion, the first region of the grating layer being located between the pair of first trenches; and
a pair of second trenches defining both side faces of the semiconductor ridge structure portion, wherein
the pair of first trenches penetrates through the active layer and the grating layer,
the pair of first trenches defines both side faces of the active layer and the grating layer in the first semiconductor stack portion,
the side faces of the first semiconductor stack portion are separated from the side faces of the semiconductor ridge structure portion in a second direction that intersects the first direction,
the first region of the grating layer has an end extending in the second direction, and
the end of the first region of the grating layer reaches the first trench.
2. The semiconductor laser device according to claim 1, wherein the pair of first trenches electrically separates the first region of the grating layer from the second region of the grating layer.
3. The semiconductor laser device according to claim 1, further comprising:
a second semiconductor stack portion provided on the first semiconductor stack portion, the second semiconductor stack portion including the cladding layer, wherein the pair of second trenches has bottoms provided on the first semiconductor stack portion, and the pair of first trenches is provided in the bottoms of the pair of second trenches.

4. The semiconductor laser device according to claim 3, wherein each of the first trenches has a smaller opening width in the second direction than a width of a portion of an inner surface of the second trench in the second direction, the portion of the inner surface of the second trench being constituted by the first semiconductor stack portion.

5. The semiconductor laser device according to claim 1, further comprising:

a second semiconductor stack portion that includes the cladding layer and that is provided on the first semiconductor stack portion, wherein each of the pair of second trenches is provided between one of the pair of first trenches and the semiconductor ridge structure portion.

6. The semiconductor laser device according to claim 1, further comprising:

an insulating film provided on a top surface of the semiconductor ridge structure portion, inner surfaces of the pair of first trenches, and inner surfaces of the pair of second trenches; and an electrode provided on the semiconductor ridge structure portion, wherein the electrode is in direct contact with the top surface of the semiconductor ridge structure portion through an opening formed in the insulating film.

7. A method for producing a semiconductor laser device, comprising the steps of:

forming a grating layer on a semiconductor substrate, the grating layer having a first region and a second region;

forming a diffraction grating having periodic projections and recesses in the first region of the grating layer;

forming an active layer on the grating layer and a cladding layer on the active layer;

forming a first mask on the cladding layer;

forming a semiconductor ridge structure portion extending in a first direction by etching the cladding layer with the first mask;

forming a second mask on the semiconductor ridge structure portion; and forming a pair of first trenches along both side faces of the semiconductor ridge structure portion by etching the active layer and the grating layer with the second mask until the pair of first trenches penetrates through the grating layer, the pair of first trenches defining both side faces of the active layer and the grating layer, wherein in the step of forming the semiconductor ridge structure portion, the semiconductor ridge structure portion is formed by forming a pair of second trenches, the pair of second trenches defining both side faces of the semiconductor ridge structure portion, the side faces of the active layer and the grating layer are separated from the side faces of the semiconductor ridge structure portion in a second direction intersecting with the first direction, and in the step of forming the pair of first trenches, the pair of first trenches is formed in the first region of the grating layer.

8. The method according to claim 7, wherein, in the step of forming the diffraction grating, a mask having a pattern for forming the diffraction grating is formed by an electron beam lithography method in the first region, and the grating layer in the first region is etched by using the mask to form the diffraction grating, the first region having a width smaller than a width of the semiconductor substrate in the second direction.

9. The method according to claim 7, wherein, in the step of forming the pair of first trenches, the pair of first trenches is formed by etching portions of the active layer and the grating layer that are located at the bottoms of the pair of second trenches.

\* \* \* \* \*